United States Patent
Shim et al.

(10) Patent No.: US 6,531,784 B1
(45) Date of Patent: Mar. 11, 2003

(54) SEMICONDUCTOR PACKAGE WITH SPACER STRIPS

(75) Inventors: Il Kwon Shim, Singapore (SG); Kambhampati Ramakrishna, Chandler, AZ (US); Vincent DiCaprio, Mesa, AZ (US)

(73) Assignee: Amkor Technology, Inc., Chandler, AZ (US)

( * ) Notice: Subject to any disclaimer, the term of this patent is extended or adjusted under 35 U.S.C. 154(b) by 0 days.

(21) Appl. No.: 09/585,915

(22) Filed: Jun. 2, 2000

(51) Int. Cl.⁷ .............................................. H01L 23/48
(52) U.S. Cl. ...................... 257/777; 257/779; 257/686; 257/780; 257/784
(58) Field of Search ................................ 257/668, 673, 257/686, 685, 693, 696, 703, 737, 738, 777, 780, 784, 779

(56) References Cited

U.S. PATENT DOCUMENTS

| | | | |
|---|---|---|---|
| 3,851,221 A | 11/1974 | Beaulieu et al. ............. | 317/100 |
| 4,103,318 A | 7/1978 | Schwede ..................... | 361/388 |
| 4,361,261 A | 11/1982 | Elles et al. .................. | 228/103 |
| 4,444,349 A | 4/1984 | Bilane et al. ................ | 228/102 |
| 4,586,642 A | 5/1986 | Dreibelbis et al. ........... | 228/4.5 |
| 4,730,232 A | 3/1988 | Lindberg ..................... | 361/381 |
| 4,763,188 A | 8/1988 | Johnson ........................ | 357/74 |
| 4,982,265 A | 1/1991 | Watanabe et al. ............. | 357/75 |
| 5,012,323 A | 4/1991 | Farnworth .................... | 357/75 |
| 5,025,306 A | 6/1991 | Johnson et al. ............... | 357/75 |
| 5,040,052 A | 8/1991 | McDavid ...................... | 357/80 |
| 5,140,404 A | 8/1992 | Fogal et al. ................... | 357/70 |

(List continued on next page.)

FOREIGN PATENT DOCUMENTS

| | | | | |
|---|---|---|---|---|
| JP | 61059562 A | 3/1986 | ........... | H01L/25/04 |
| JP | 61117858 A | 6/1986 | ........... | H01L/25/08 |
| JP | 62119952 A | 6/1987 | ........... | H01L/25/04 |
| JP | 62126661 A | 6/1987 | ........... | H01L/25/04 |
| JP | 62142341 A | 6/1987 | ........... | H01L/25/04 |
| JP | 63128736 | 6/1988 | ........... | H01L/23/04 |
| JP | 63211663 A | 9/1988 | ........... | H01L/25/08 |
| JP | 63244654 | 10/1988 | ........... | H01L/23/28 |
| JP | 01099248 A | 4/1989 | ........... | H01L/25/08 |
| JP | 04028260 A | 1/1992 | ......... | H01L/25/065 |
| JP | 4056262 | 2/1992 | ......... | H01L/25/065 |
| JP | 04056262 A | 2/1992 | ......... | H01L/25/065 |
| JP | 404359461 A | * 12/1992 | | |
| JP | 62126661 | 6/1997 | ........... | H01L/25/04 |
| JP | Hei 10-56470 | 9/1998 | ......... | H01L/25/065 |

OTHER PUBLICATIONS

Tummala, Rao R., et al., "Microelectronics Packaging Handbook," 1989, pp. 391–402.

*Primary Examiner*—Albert W. Paladini
*Assistant Examiner*—Luan Thai
(74) *Attorney, Agent, or Firm*—Skjerven Morrill LLP; James E. Parsons

(57) ABSTRACT

A semiconductor package incorporates spacer strips enabling one or more semiconductor dies having central terminal pads to be stacked on top of one another within the package and reliably wire bonded to an associated substrate without shorting of the bonded wires. Each of the spacer strips comprises a flat, elongated strip of an insulative material that mount at edges of a surface of a die such that they straddle the central terminal pads thereon. The die is electrically connected to the substrate by a plurality of fine conductive wires having a first end bonded to one of the central terminal pad on the die, a second end bonded to a terminal pad on the substrate, and an intermediate portion between the first and second ends that passes transversely across the top surface of one of the spacer strips. The spacer strips have spaced pads or grooves on or in their top surfaces that captivate the individual wires and thereby redistribute the wires and prevent them from contacting the die and each other.

37 Claims, 5 Drawing Sheets

U.S. PATENT DOCUMENTS

| | | | |
|---|---|---|---|
| 5,168,368 A | 12/1992 | Gow, III et al. | 257/666 |
| 5,172,215 A | 12/1992 | Kobayashi et al. | 257/584 |
| 5,176,311 A | 1/1993 | Levine et al. | 228/179 |
| 5,177,032 A | 1/1993 | Fogal et al. | 437/220 |
| 5,291,060 A | 3/1994 | Shimizu et al. | 257/667 |
| 5,291,061 A | 3/1994 | Ball | 257/686 |
| 5,323,060 A | 6/1994 | Fogal et al. | 257/777 |
| 5,334,875 A | 8/1994 | Sugano et al. | 257/686 |
| 5,384,689 A | 1/1995 | Shen | 361/761 |
| 5,432,729 A | 7/1995 | Carson et al. | 365/63 |
| 5,495,398 A | 2/1996 | Takiar et al. | 361/790 |
| 5,498,901 A | 3/1996 | Chillara et al. | 257/666 |
| 5,502,289 A | 3/1996 | Takiar et al. | 174/266 |
| 5,620,928 A | 4/1997 | Lee et al. | 438/118 |
| 5,682,062 A | 10/1997 | Gaul | 257/686 |
| 5,714,405 A * | 2/1998 | Tsubosaki et al. | 437/206 |
| 5,715,147 A | 2/1998 | Nagano | 361/813 |
| 5,721,452 A | 2/1998 | Fogal et al. | 257/685 |
| 5,739,581 A | 4/1998 | Chillara et al. | 257/668 |
| 5,804,874 A * | 9/1998 | An et al. | 257/676 |
| 5,815,372 A | 9/1998 | Gallas | 361/760 |
| 5,872,025 A | 2/1999 | Cronin et al. | 438/109 |
| 5,886,412 A | 3/1999 | Fogal et al. | 257/777 |
| 5,989,982 A | 11/1999 | Yoshikazu | 438/462 |
| 6,005,778 A | 12/1999 | Spielberger et al. | 361/770 |
| 6,013,948 A | 1/2000 | Akram et al. | 257/698 |
| 6,030,855 A | 2/2000 | Bertin et al. | 438/109 |
| RE36,613 E | 3/2000 | Ball | 257/777 |
| 6,033,931 A | 3/2000 | Hoffman et al. | 438/109 |
| 6,051,886 A | 4/2000 | Fogal et al. | 257/777 |
| 6,057,598 A | 5/2000 | Payne et al. | 257/723 |

* cited by examiner

SEMICONDUCTOR PACKAGE WITH SPACER STRIPS

BACKGROUND

1. Field of the Invention

This invention generally relates to semiconductor packages, and in particular, to semiconductor packages having spacer strips that enable one or more semiconductor dies having central terminal pads thereon to be stacked on top of one another and reliably wire bonded to an associated substrate.

2. Description of the Related Art

A typical semiconductor package includes a connective substrate, such as a lead frame or a laminate, that has a semiconductor die, or "microchip," mounted on a surface thereof and electrically connected to the substrate by, e.g., a plurality of fine conductive wires that bond at opposite ends to input/output terminal pads on the tops of the die and the substrate, respectively.

Some dies, such as memory chips, have their terminal pads located in a central portion of the die's active surface, as opposed to at their peripheral edges. Wire bonding of these types of dies can be more problematical because the wires must traverse not only the vertical distance from the edges of the die to the substrate, but also a greater horizontal distance from the edges of the die to the centrally located terminal pads thereon. This increase in the distance traversed by the wires increases the possibility that one or more of the wires may contact the surface of the die and/or each other, and thereby short out. This problem is exacerbated if another die is stacked on top of the first die, as is sometimes done to increase package component density. The problem then becomes one of preventing the wires from shorting to the second die, as well as to the first die and each other.

A need therefore exists in the industry for a semiconductor package incorporating an apparatus that enables one or more semiconductor dies having central terminal pads thereon to be stacked on top of one another in the package and reliably wire bonded to an associated substrate without shorting of the bonding wires to the die(s) and/or each other.

SUMMARY OF THE INVENTION

This invention provides a semiconductor package incorporating "spacer strips" that enable one or more semiconductor dies having central terminal pads to be stacked on top of one another within the package and reliably wire bonded to an associated substrate without shorting of the bonded wires.

The novel package includes a connective substrate having top and bottom surfaces. The bottom surface of a first semiconductor die is attached to the top surface of the substrate. The die has a top surface with a plurality of terminal pads formed on a central portion thereof.

A first pair of spacer strips is mounted on the top surface of the die at its opposite edges such that they straddle the central terminal pads on the die. Each of the spacer strips comprises a flat, elongated strip of an insulative material having a top surface, an opposite bottom surface that is attached to the top surface of the die, and a thickness between the top and bottom surfaces.

The die is electrically connected to the substrate by a plurality of fine conductive wires. In one embodiment, each of the wires has a first end bonded to a corresponding central terminal pad on the die, a second end bonded to a corresponding terminal pad on the first surface of the substrate, and an intermediate portion between the first and second ends that passes transversely across the first surface of a corresponding one of the spacer strips. The spacer strips have spaced transverse grooves in their top surfaces that captivate the intermediate portion of each individual wire, thereby redistributing the wires and isolating them from the die and from each other.

In another embodiment, the spacer strips have spaced bonding pads on their top surfaces. Each of the wires has a first end bonded to a corresponding central terminal pad on the die, a second end bonded to a corresponding terminal pad on the first surface of the substrate, and an intermediate portion between the first and second ends that is bonded to a corresponding one of the bonding pads on a corresponding one of the spacer strips.

In yet another embodiment, the conductive wires comprise associated pairs of wires. A first wire in each pair has a first end bonded to a corresponding terminal pad on the die and a second end bonded to a corresponding bonding pad on a corresponding spacer strip. A second wire in each pair has a first end bonded to a corresponding terminal pad on the substrate and a second end bonded to the same bonding pad on the spacer strip to which the second end of the first wire in the pair is bonded.

A second die can be mounted directly on top of the spacer strips on the first die. Alternatively, a second pair of spacer strips can be mounted on the bottom surface of the second die before it is mounted on top of the first die. Each of the strips in the second pair of spacer strips is positioned in facing opposition to a respective one the strips in the first pair of spacer strips on the first die. The strips cooperate to space the second die above the first die at a controlled distance and prevent the second die from contacting the bonding wires on the first die.

A better understanding of the above and other features and advantages of the present invention may be had from the detailed description below of certain exemplary embodiments thereof, particularly if such consideration is made in conjunction with the several views of the associated drawings.

DETAILED DESCRIPTION OF THE EXEMPLARY EMBODIMENTS

Figure 1:
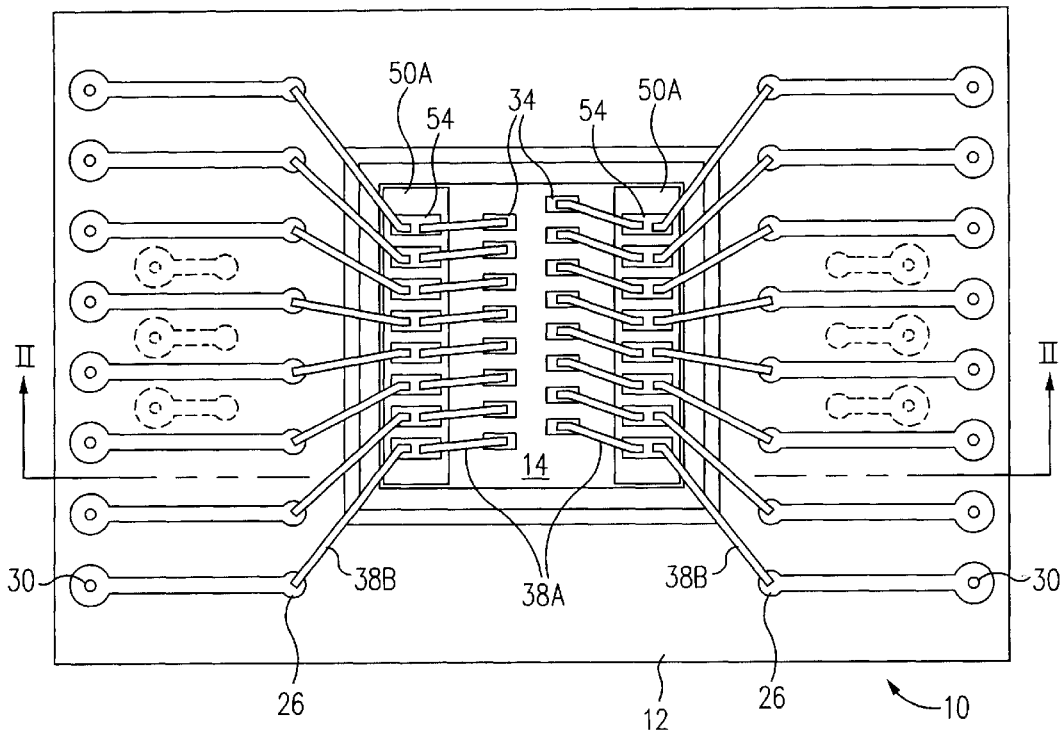
FIG. 1 is a top plan view of a semiconductor package incorporating spacer strips in accordance with one exemplary embodiment of the present invention.
Figure 2:
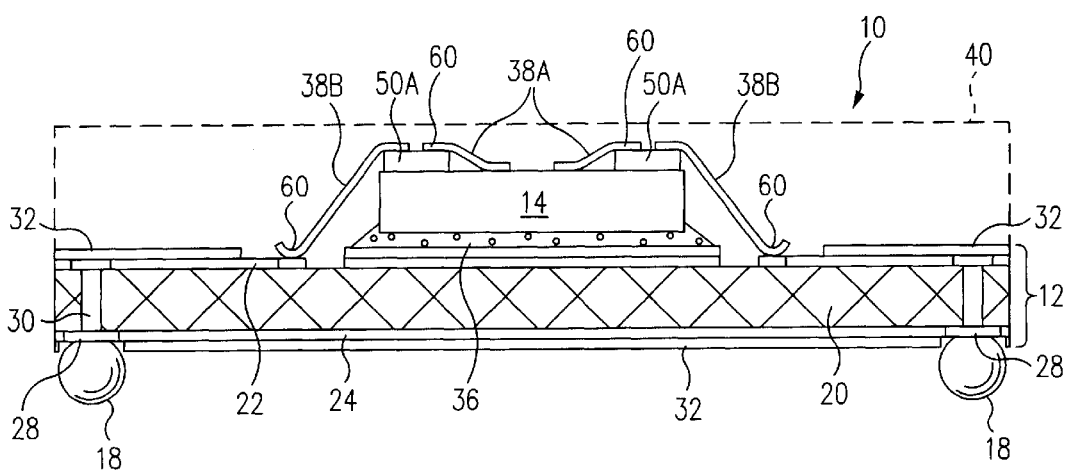
FIG. 2 is a cross-sectional, side elevation view of the semiconductor package shown in FIG. 1, as revealed by the section taken along the lines II—II therein, shown with a single, first die.
Figure 3:
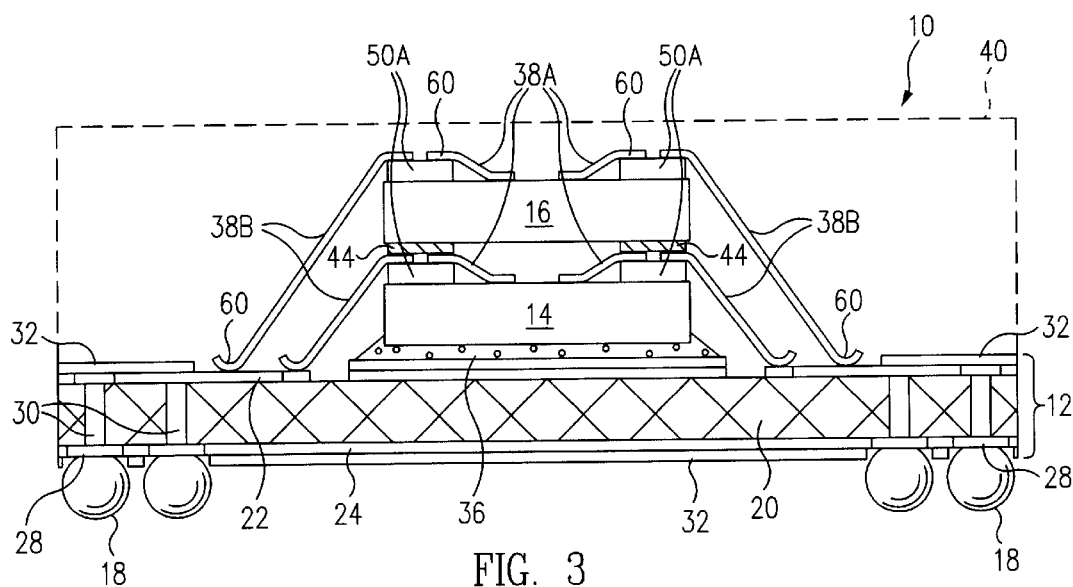
FIG. 3 is a cross-sectional, side elevation view of the semiconductor package shown in FIG. 1, shown with a second die stacked on top of the first.

FIGS. 1, 2 and 3 are a top plan, and two cross-sectional side elevation views, respectively, of a semiconductor package 10 incorporating spacer strips 50A in accordance with two exemplary embodiments of this invention. The packages 10 conventionally include a connective substrate 12 and a first semiconductor die 14 mounted on the top surface of the substrate. In the second, "stacked-die" embodiment illustrated in FIG. 3, a second die 16 has been mounted on top of the first die 14 in the manner described below.

The connective substrate 12 may comprise a flexible resin tape, a rigid fiberglass laminate, a ceramic coupon, or a metal lead frame, all of known types in the industry, depending on the particular type of semiconductor package 10 at hand. The exemplary package 10 illustrated in the figures is a ball grid array ("BGA") type of package, so-called because of the balls of solder 18 formed on the bottom surfaces of the respective substrates 12 that constitute the input/output terminals of the respective packages 10. However, it should be understood that the teachings of this invention are applicable to other types of semiconductor packages having other types of input/output terminals, as well.

The connective substrate 12 illustrated comprises a layer 20 of an insulative material, e.g., a polyimide resin film, laminated between conductive layers 22, 24 of a metal, e.g., copper or aluminum, that comprise the top and bottom surfaces of the substrate, respectively. The conductive layers 22, 24 are typically patterned, e.g., by photolithography techniques, to define terminal pads 26 in the top layer 22 and solder ball lands 28 in the bottom layer 24. The terminal pads 26 are connected to the solder ball lands 28 through the thickness of the insulative layer 20 by vias 30, i.e., plated-through holes in the layers. Either or both of the conductive layers 22, 24 may be coated over with an insulative "solder mask" 32 having openings in it through which the respective terminal pads 26 and solder ball lands 28 are exposed, and which serves to prevent bridging between the pads and/or lands by accidental solder splashes.

The dies 14 and 16 typically include a plurality of input/output terminal pads 34 (see FIGS. 4 and 5) located on their respective top, or "active," surfaces. In some types of dies, typically memory devices, these pads 34 may be located in a central portion of the die, as shown in the plan view of FIGS. 1, 10, and 11, and in the isometric views of FIGS. 4 and 5. During fabrication of the package, the first die 14 is mounted on the substrate 12 by, e.g., a layer of an adhesive 36, such as an epoxy resin.

After the die 14 is mounted to the substrate, it is electrically connected to the substrate 12 by a plurality of fine, conductive wires, typically made of gold or aluminum. Wire bonding is typically effected with automated bonding equipment employing well-known thermal-compression or ultrasonic bonding techniques. After the die 14 is wire bonded to the substrate 12, the die, substrate, and conductive wires are overmolded with a dense, monolithic body 40 (shown dotted in FIGS. 2 and 3) of plastic, typically a filled epoxy resin, to protect the packaged parts from environmental elements, and particularly moisture.

As may be seen in the embodiments illustrated in FIGS. 1–3, because the terminal pads 34 on the top of the first die 14 are located in the central portion of the die, the wires must traverse not only the vertical distance from the edges of the die to the substrate 12, but also the horizontal distance from the edges of the die to the centrally located terminal pads 34. This distance is greater than if the terminal pads 34 were located on the peripheral edges of the die, as they are in other cases, and this greater distance traversed by the wires increases the probability that one or more of them may contact a surface or edge of the die 14 and/or another wire, particularly during the "wire-sweep" that occurs during overmolding of the package body 40, thereby shorting out the wire(s) and resulting in a defective device. This problem is exacerbated in stacked-die structures because of the added possibility that the wires may contact the closely overlying second die 16.

However, it has been discovered that the wire shorting problem can be eliminated simply and inexpensively in both single- and multiple-die types of packages by the provision of one or more pairs of "spacer strips" 50A, 50B, and 50C, such as those illustrated in the figures and described in more detail below.

Figure 4:
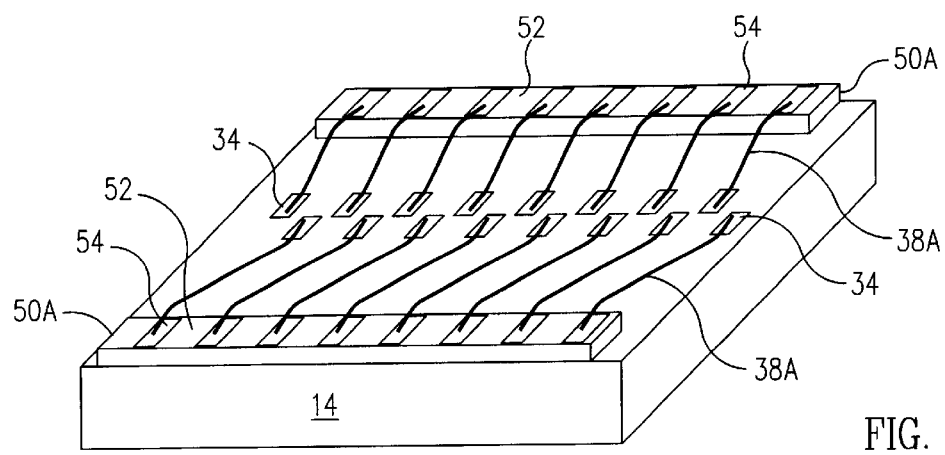
FIG. 4 is an isometric view of a semiconductor die having central terminal pads on its top surface and a pair of spacer strips attached thereto in accordance with another exemplary embodiment of this invention.

A first embodiment of the spacer strips 50A is shown in the isometric view of FIG. 4 and as employed in the single- and stacked-die packages 10 illustrated in FIGS. 1–3, and 7 and 8, respectively. A second embodiment of the spacer strips 50B is shown in the isometric view of FIG. 5, and as employed in the stacked-die package 10 configuration illustrated in FIG. 9. A third embodiment of the spacer strips 50C is shown in the isometric view of FIG. 6, and as employed in conjunction with the other spacer strip embodiments 50A and 50B in the stacked die embodiments illustrated in FIGS. 7–9.

Each of the exemplary spacer strips 50A, 50B, and 50C comprises a flat, elongated strip of an insulative material having a first surface 52, and a second surface opposite thereto.

As shown in FIG. 4, the first surface 52 of the first embodiment of spacer strips 50A has a plurality of conductive bonding pads 54 thereon. In use, the second surfaces of a pair of the spacer strips 50A are attached, e.g., with an adhesive, at opposite edges of the top surface of the die 14 such that they straddle the central terminal pads 34 on the die (see FIGS. 1 and 4). The die 14 is then attached to the substrate 12, as above. In the single-die embodiment illustrated in FIG. 2, the conductive bonding wires comprise a first wire 38A having a first end bonded to one of the terminal pads 34 on the die 14 and a second end bonded to a corresponding one of wire bonding pads 52 on a corresponding one of the spacer strips 50A, and a second wire 38B having a first end bonded to a terminal pad 26 on the substrate 12 and a second end bonded to the corresponding wire bonding pad 54 on the corresponding spacer strip 50A.

Figure 2A:
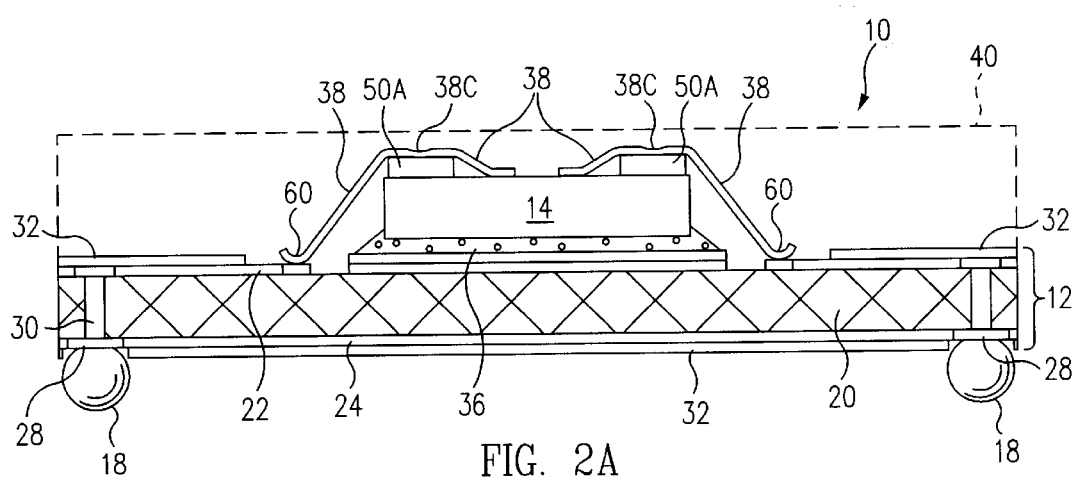
FIG. 2A is a cross-sectional side elevation view of a semiconductor package in accordance with another exemplary embodiment of the present invention.

Alternatively, the first and second conductive wires 38A and 38B can comprise a single wire 38 having a first end bonded to a terminal pad 34 on the die 12, a second end bonded to a terminal pad 26 on the substrate 12, and an intermediate portion 38C bonded to a corresponding one of the wire bonding pads 54 on a corresponding spacer strip 50A, as shown in FIG. 2A.

After the first die 14 is wire bonded to the substrate 12, the second die 16 can be mounted on top of the first die 14, typically with another layer of an insulative adhesive 44, for example, a double-backed adhesive film, to form a "stacked die" structure, as illustrated in FIG. 3. After the second die 16 is mounted, it is wire bonded to the substrate 12 in a procedure similar to that described above for the first die 14.

In a variation of the foregoing wire bonding process that is available with the first embodiment of spacer strips 50A, a pair of the spacer strips 50A are attached to a die 14 and/or 16, as above, and the die then "partially" wire bonded, i.e., with only the first one of the wires 38A, from the central pads 34 on the die to the corresponding bonding pads 54 on the spacer strips 50A, as illustrated in FIG. 4. This partial wire bonding of the dies can be effected separately from the rest of the packaging operation, and the partially wire-bonded die-spacer strip assemblies can be cached for later use, at which point they can be treated as conventional dies having wire bonding terminal pads at their edges, instead of their central portions.

Figure 5:
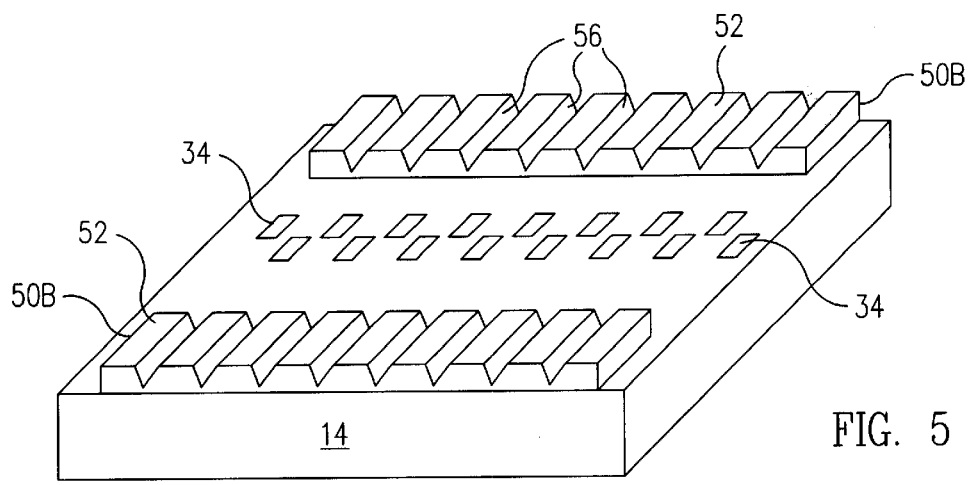
FIG. 5 is an isometric view of a semiconductor die having central terminal pads on its top surface and a pair of spacer strips attached thereto in accordance with another exemplary embodiment of this invention.

As shown in FIG. 5, the first surface 52 of the second embodiment of spacer strips 50B has a plurality of transverse grooves 56 in it. In use, the second surfaces of a pair of the second embodiment of spacer strips 50B are mounted, e.g., with an adhesive, on the top surface of the die 14 at opposite edges thereof such that they straddle the central terminal pads 34 on the die, as in the case of the first embodiment 50A above.

Figure 9:
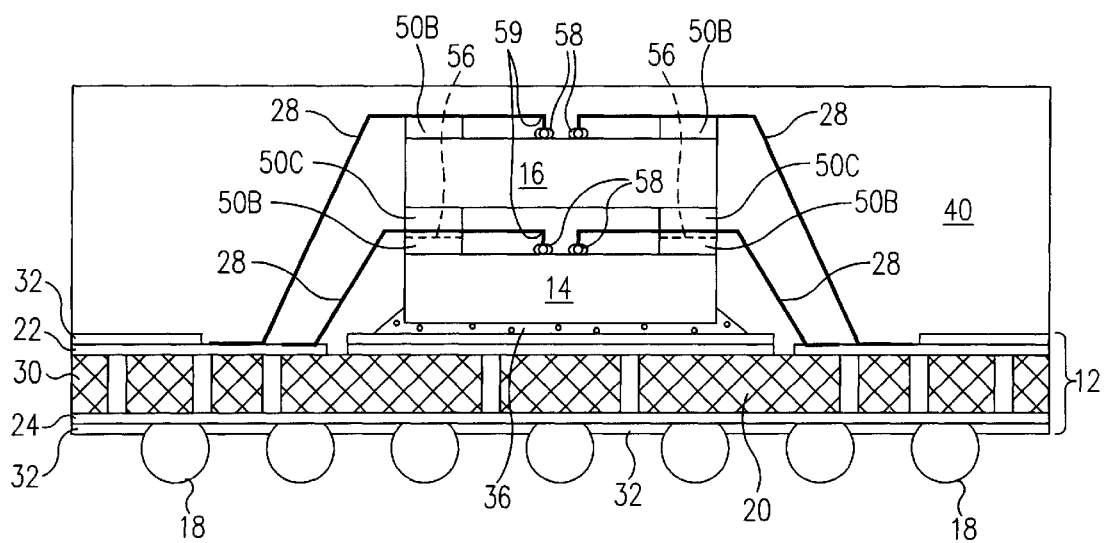
FIG. 9 is a cross-sectional, side elevation view of a semiconductor package in accordance with another exemplary embodiment this invention.

In the second embodiment, the die 14 is attached to the substrate 12, as above, and the conductive wires 38 are then bonded, first to a corresponding one of the terminal pads 34 on the die, then down to a corresponding one of the terminal pads 26 on the substrate 12, or vice-versa, such that, in either case, an intermediate portion of each of the wires 38 is channeled through a corresponding one of the grooves 56 in a corresponding one of the spacer strips 50B (see FIG. 9). A similar procedure is followed with respect to the second die 16 after it is attached to the top surface of the first die 14, as above.

The spacer strips 50A or 50B thus serve to captivate the bonding wires 38 and keep them separated from one another and from the surfaces of the dies 14 and 16, thereby preventing the wires from shorting and resulting in a defective device.

Figure 6:
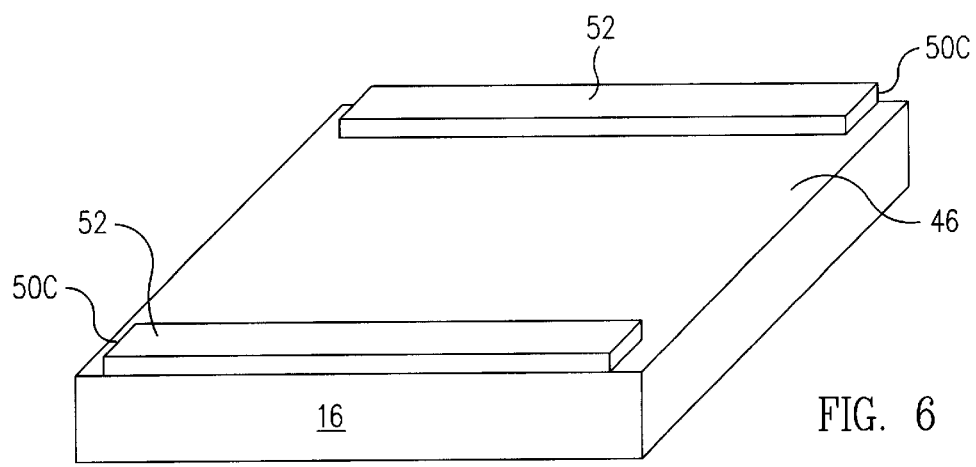
FIG. 6 is an isometric view of a semiconductor die having a pair of spacer strips attached to its bottom surface in accordance with another exemplary embodiment of this invention.

The third embodiment of the spacer strips 50C can also serve as a convenient agent for the attachment of a second die 16 to the first die 14, as well as to prevent shorting between the second die and the bonding wires 38, or 38A and 38B on the top of the first die 14. As illustrated in FIG. 6, unlike the other two embodiments, the third embodiments of the spacer strips 50C have a plain, flat, insulative first surface 52. As shown in FIG. 6, the third embodiment of spacer strips 50C is used by mounting the second surfaces of a pair of the strips 50C on the bottom surface 46 of the second die 16, e.g., with an adhesive, such that the first surfaces 52 of the spacer strips face away from the die. The strips 50C may be mounted at the edges of the bottom surface of the die 16, as shown in FIGS. 6, 7, and 9, or on a larger die, they can be mounted inboard of the die's edges so that they correspond to the positions of a first pair of spacer strips 50A or 50B on a smaller, underlying first die 14, as shown in FIG. 8.

Figure 7:
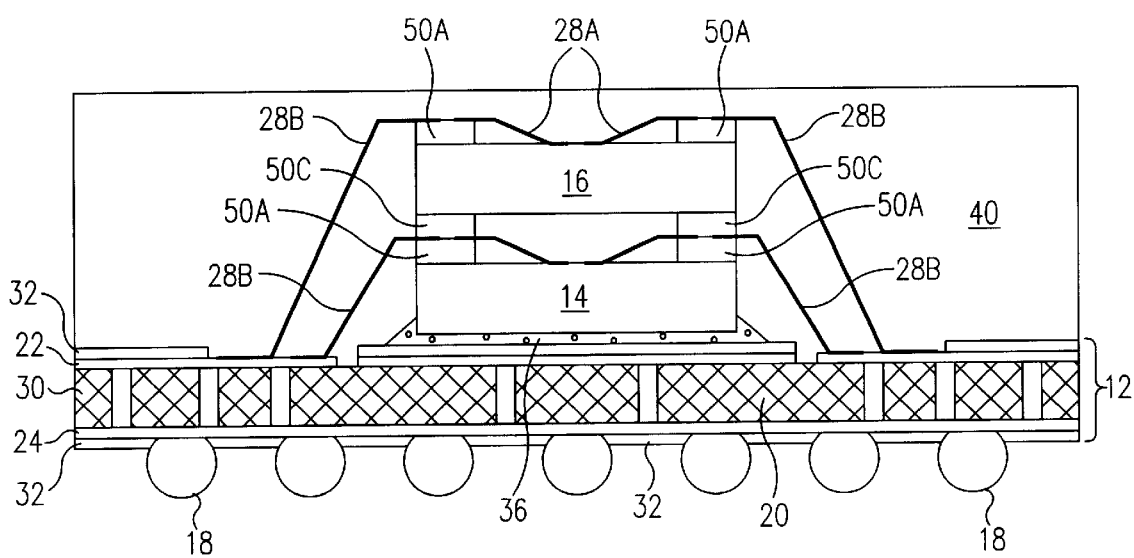
FIG. 7 is a cross-sectional, side elevation view of a semiconductor package in accordance with another exemplary embodiment this invention.
Figure 8:
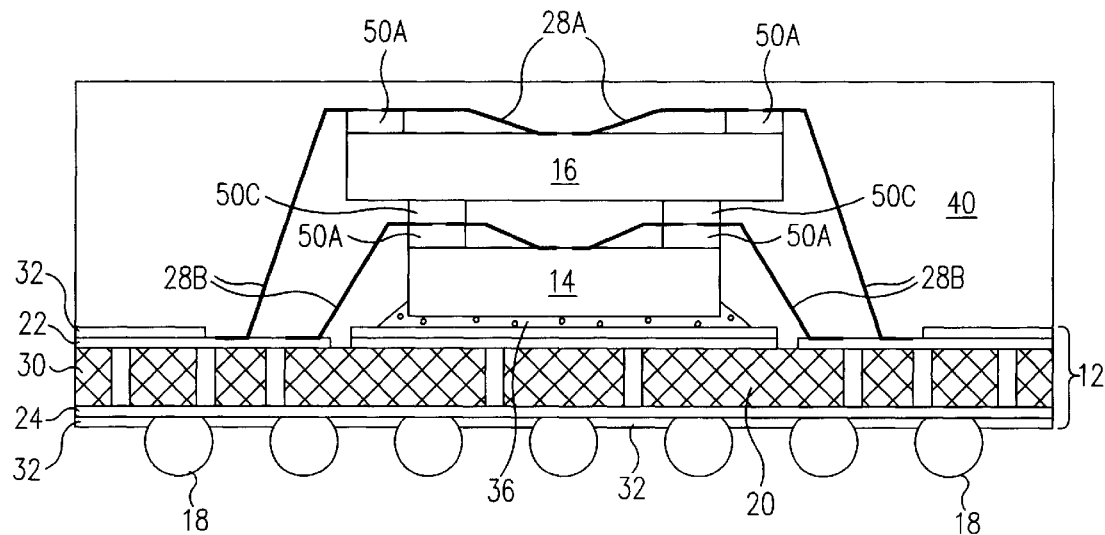
FIG. 8 is a cross-sectional, side elevation view of a semiconductor package in accordance with another exemplary embodiment this invention.

As shown in each of FIGS. 7–9, the bottom surface 46 of the second die 16 (and, hence, the first surfaces 52 of the second pair of spacer strips 50C) is then placed over the top surface of the first die 14 such that corresponding pairs of the respective first surfaces 52 of the spacer strips in respective ones of the first and second pairs thereof are in opposed alignment with each other. A portion of each of the conductive wires 38, or 38A and 38B on the first die 14 passes between a corresponding one of the corresponding pairs of opposing first surfaces of the spacer strips and is captivated between them. The second die 16 may then be attached by a layer of adhesive between each of the corresponding pairs of first surfaces 52 of the respective first and second pairs of spacer strips.

As may be seen in FIGS. 7–9, the second pair of spacer strips 50C on the bottom surface of the second die 16 serve as "standoffs" for the die 16 and prevent the bonding wires 38, 38A, 38B on the first die 14 from shorting to each other and/or the second die.

As an additional benefit, the spacer strips 50A, 50B can serve as "spacers" to control the height between the dies of a stacked die package, in the following manner. Those of skill in the packaging art will recognize that, in connection with the bonding of the conductive wires 38, 38A, 38B, the vertical height of wires bonded with so-called "ball bonds" 58, such as those shown on the tops of the dies 14 and 16 in FIG. 9, is greater than that of wires bonded with so-called "stitch," "crescent," or "wedge" bonds 60, such as those shown on top of the dies in FIGS. 1–8. This is because a ball-bonded wire 38 departs from the underlying bonding surface perpendicularly, then transitions laterally through a relatively sharp bend 59, as shown in FIG. 9, whereas, wires 38A, 38B bonded with the latter, stitch-type of bonds 60, which are made with the wire 38A, 38B nearly parallel to the bonding surface, transition through a much more gradual bend. (Compare, e.g., FIGS. 8 and 9.)

As a result of the relatively greater height above the die of a wire bonded thereon with a ball bond 58, extra care must be taken when attaching a second die 16 on the top surface of a first die 14 having ball bonded wires 38 thereon, as shown in FIG. 9, to accurately control the spacing between the two dies such that the second die does not interfere with or impose undue mechanical stresses on the wires 38. If corresponding, opposing pairs of spacer strips 50A or 50B and 50C are employed to mount the second die 16 on the first die 14, as described above, the resulting spacing between the two dies is easily and precisely controlled simply by controlling the thicknesses of the respective spacer strips.

The jumper strips 50A, 50B, and 50C can be made of a variety of insulative materials and by a variety of techniques. For example, they can be fabricated from a resin tape or a sheet of fiberglass impregnated with an epoxy resin using conventional circuit tape or PCB fabrication techniques.

In other applications, a different insulative material may be more suitable. For example, it will be appreciated that there can be large differences in the respective thermal coefficients of expansion (TCE) of the dies 14, 16 and the substrate 12. Thus, the substrate 12, which may be made of a laminate having a TCE of approximately 15–18 parts-per-million per degree Centigrade (PPM/° C.)), will experience a much greater amount of thermal expansion and contraction with heating and cooling, respectively, than do the dies 14 and 16, which are typically made of silicon (TCE=4 PPM/° C.) or other semiconductor material. This difference in their respective amounts of thermal expansion and contraction can impose substantial shear stresses on the respective elements in the package, and particularly the dies, with large temperature excursions.

Thus, in applications intolerant of large thermal stresses, it may be desirable to fabricate the spacer strips 50A, 50B, and 50C from an insulative material that more closely matches the TCE of the dies 14 and 16, plus or minus about 2.5 PPM/° C., e.g., a ceramic. For example, the spacer strips 50A and 50B can be fabricated from a coupon of silicon oxide, gallium arsenide quartz, alumina, aluminum nitride, or a laminate of the foregoing materials, using conventional semiconductor fabrication techniques and equipment.

In the foregoing exemplary embodiments, the spacer strips 50A, 50B, and 50C are shown and described as deployed in individual pairs mounted on individual dies 14 and 16. However, it has been discovered that an economy in manufacturing costs can be realized if the spacer strips are fabricated as either elongated strips that are connected tandemly and end-to-end, or in an alternative configuration, as an array of rectangular "frames," that are mounted on the dies before the latter are cut from the parent wafer. This is illustrated in FIGS. 10 and 11, respectively.

Figure 10:
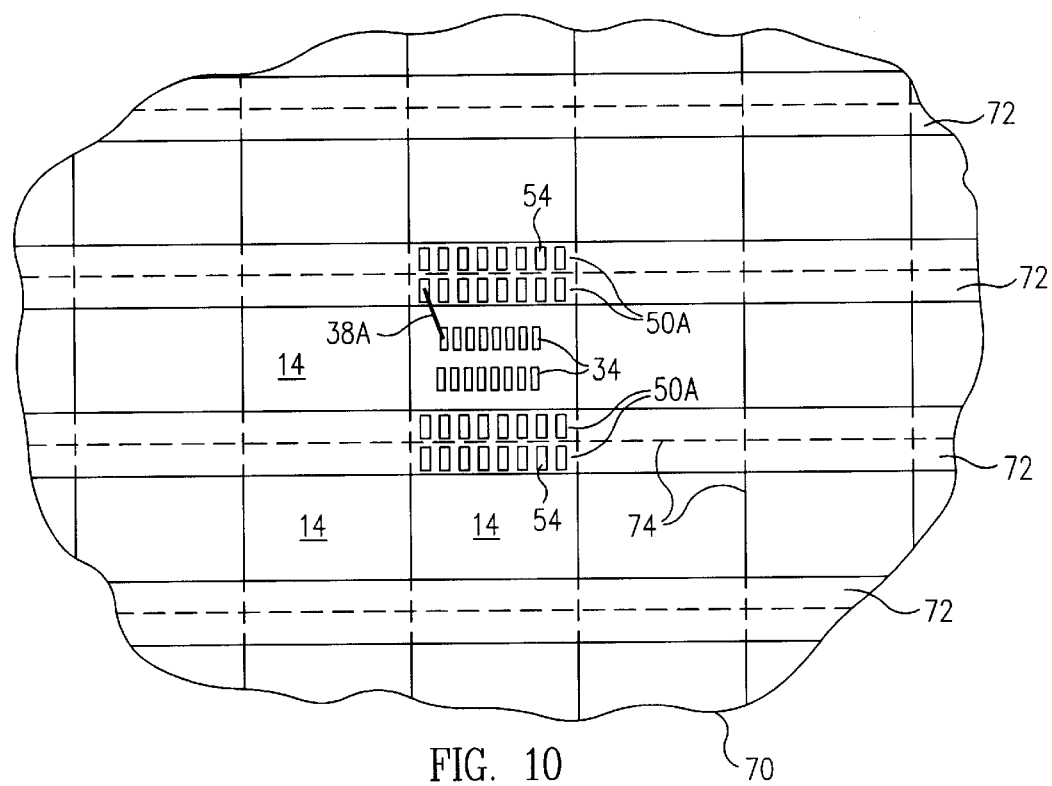
FIG. 10 is a top plan view of a portion of a semiconductor wafer having spacer strips mounted thereon in accordance with another exemplary embodiment of this invention; and, FIG. 11 is a pop plan view of a portion of a semiconductor wafer having spacer strips mounted thereon in accordance with another exemplary embodiment of this invention.

FIG. 10 shows a portion 70 of a semiconductor wafer having a plurality of dies 14 in it. Elongated strips 72, each having a plurality of spacer strips 50A connected tandemly and end-to-end with each other, are mounted on the wafer such that they straddle the "streets," or scribe lines 74 in the wafer between the dies 14. When the dies 14 are separated ("singulated") from the wafer, typically, by sawing along the scribe lines 74, both the strips 72 and the wafer are cut through simultaneously, and each die is separated with a pair of the spacer strips 50A already attached to its opposite edges, as shown in FIG. 4.

Figure 11:
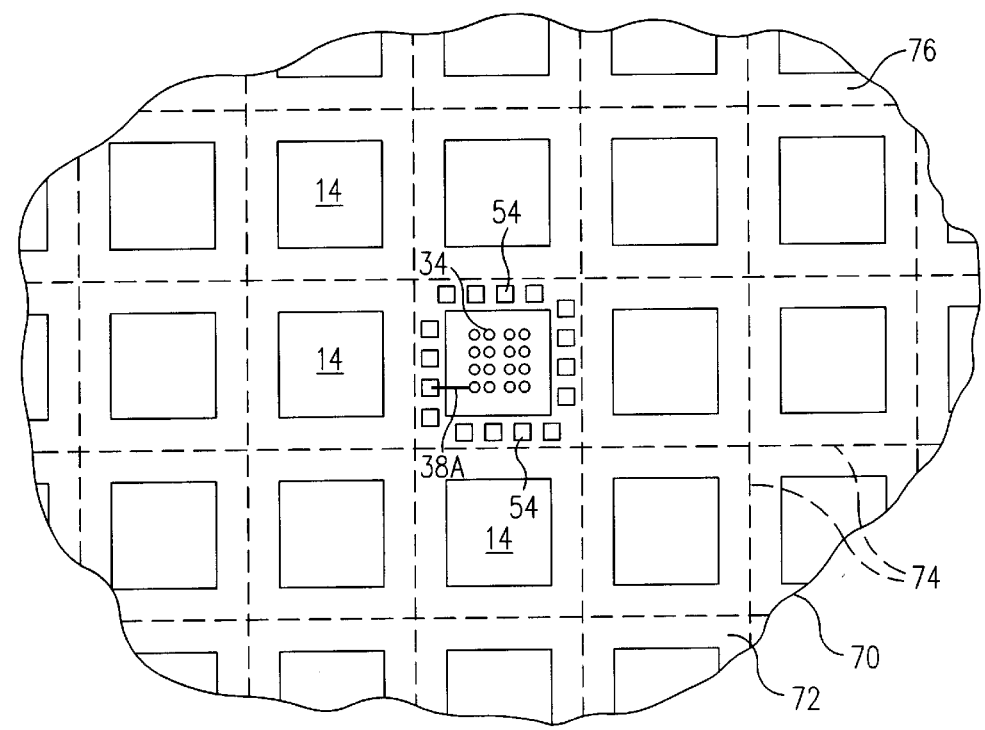

A similar arrangement is shown in FIG. 11, except that in this embodiment, it is desirable to wire bond the dies 14 at all four of their respective edges. In such an embodiment, the jumper strips 50A may be provided as rectangular frames connected together in an array 76 that is mounted on the wafer before singulation. When the wafer is sawn along the scribe lines 74, the frames are also cut simultaneously, such that each die 14 is separated with one of the rectangular frames attached to its top surface and centered over the bonding terminals 34 in the central portion of the die.

It will be understood that, in either of the two foregoing exemplary embodiments, the dies 14 can be "partially" wire bonded to their respective spacer strips 50A with conductive wires 38A before the dies are singulated from their respective wafers, as described above.

Although the spacer strips 50A, 50B, and 50C of the present invention have been described with reference to certain exemplary embodiments thereof, persons skilled in the art will recognize that many modifications may be made to these in terms of their materials and methods without departing from the spirit and scope of the invention.

In light of the foregoing, it is submitted that the scope of this invention should not be measured by that of the particular embodiments described and illustrated herein, but rather, should encompass that of the claims appended hereafter.

What is claimed is:

1. A semiconductor package, comprising:
   a substrate having opposite first and second surfaces;
   a first semiconductor die having a first surface with a plurality of terminal pads in a central portion thereof and an opposite second surface mounted on the first surface of the substrate;
   a first pair of spacer strips, each comprising a flat, elongated element of an insulative material having a first surface and an opposite second surface mounted on the first surface of the die adjacent to respective opposite edges thereof;
   a plurality of electrically conductive paths, each path connecting a terminal pad on the die to a terminal pad on the substrate and having an intermediate portion passing transversely across the first surface of one of the spacer strips;
   a means for enclosing the first semiconductor die, the first pair of spacer strips, the electrically conductive paths, and at least a portion of the first surface of the substrate within said semiconductor package,
   wherein each of the first surfaces of the spacer strips has a plurality of wire bonding pads thereon, and wherein each of the electrically conductive paths comprises
   a first metal wire having a first end bonded to one of the terminal pads on the die and a second end bonded to a corresponding one of wire bonding pads; and,
   a second metal wire having a first end bonded to a terminal pad on the substrate and a second end bonded to the corresponding wire bonding pad.

2. The semiconductor package of claim 1, further comprising a second semiconductor die having a first surface and an opposite second surface mounted on the first surfaces of the spacer strips.

3. The semiconductor package of claim 1, further comprising:
   a second semiconductor die having opposite first and second surfaces; and,
   a second pair of spacer strips, each comprising a flat, elongated member of an insulative material having a first surface and an opposite second surface mounted on the second surface of the second die,
   the second die-being mounted on the first die such that corresponding pairs of respective ones of the first surfaces of respective ones of the spacer strips in respective ones of the first and second pairs of the spacer strips are in opposed alignment with each other, and such that the respective second ends of the metal wires are disposed between a corresponding one of the pairs of opposing first surfaces of the spacer strips.

4. The semiconductor package of claim 3, wherein the first metal wires are bonded to the terminal pads on the die with ball bonds, and wherein the sum of the thicknesses of the respective spacer strips is equal to or greater than a height of the wires above the die.

5. The semiconductor package of claim 1, wherein the metal wires are bonded to the terminal pads on the die with ball bonds, and wherein the sum of the thicknesses of the respective spacer strips is equal to or greater than a height of the wires above the die.

6. A semiconductor package, comprising:
   a substrate having opposite first and second surfaces;
   a first semiconductor die having a first surface with a plurality of terminal pads in a central portion thereof and an opposite second surface mounted on the first surface of the substrate;

a first pair of spacer strips, each comprising a flat, elongated element of an insulative material having a first surface and an opposite second surface mounted on the first surface of the die adjacent to respective opposite edges thereof;

a plurality of electrically conductive paths, each path connecting a terminal pad on the die to a terminal pad on the substrate and having an intermediate portion passing transversely across the first surface of one of the spacer strips;

a means for enclosing the first semiconductor die, the first pair of spacer strips, the electrically conductive paths, and at least a portion of the first surface of the substrate within said semiconductor package;

a second semiconductor die having opposite first and second surfaces; and, a second pair of spacer strips, each comprising a flat, elongated member of an insulative material having a first surface and an opposite second surface mounted on the second surface of the second die, the second die being mounted on the first die such that corresponding pairs of respective ones of the first surfaces of respective ones of the spacer strips in respective ones of the first and second pairs of the spacer strips are in opposed alignment with each other, and such that the intermediate portions of the conductive paths pass between a corresponding one of the pairs of opposing first surfaces of the spacer strips.

7. The semiconductor package of claim 6, the metal wires are bonded to the terminal pads on the die with ball bonds, and wherein the sum of the thicknesses of the respective spacer strips is equal to or greater than a height of the wires above the die.

8. The semiconductor package of claim 6, wherein the second semiconductor die includes a first surface with an outer edge, and terminal pad at the first surface; and further comprising:

a second insulative spacer and a second electrically conductive path covered by the means, wherein the second insulative spacer includes a first surface, and an opposite second surface coupled to the first surface of the second semiconductor die between the terminal pad and the outer edge, and the second electrically conductive path passes across the first surface of the second insulative spacer and electrically couples the terminal pad of the second semi-conductor die to the substrate.

9. The semiconductor package of claim 6, wherein the electrically conductive path comprises a metal wire bonded to the terminal pad on the semiconductor die with a ball bond, and, a thickness of the spacer is equal to or greater than a height of the wire above the die.

10. A semiconductor package comprising:

a substrate;

a semiconductor die coupled to the substrate, said semiconductor die including a first surface with an outer edge, and terminal pad at the first surface;

an insulative spacer having a first surface, and an opposite second surface coupled to the first surface of the semiconductor die between the terminal pad and the outer edge;

an electrically conductive path passing across the first surface of the spacer and electrically coupling the terminal pad to the substrate; and a means coupled to the substrate for protectively covering the semiconductor die, the spacer, the electrically conductive path, and at least a portion of the substrate, wherein the spacer includes a groove in the first surface that extends parallel to a direction of the electrically conductive path, and said electrically conductive path passes through said groove.

11. The semiconductor package of claim 10, wherein the electrically conductive path is a single electrical conductor extending from the terminal pad to the substrate.

12. The semiconductor package of claim 10, wherein the electrically conductive path comprises a metal wire bonded to the terminal pad on the semiconductor die with a ball bond, and a thickness of the spacer is equal to or greater than a height of the wire above the die.

13. The semiconductor package of claim 10, further comprising a second semiconductor die within said package over the first semiconductor die, wherein the second semiconductor is coupled to the first surface of the insulative spacer through an insulative layer, and is electrically coupled to the substrate.

14. The semiconductor package of claim 13, wherein the electrically conductive path is a single electrical conductor extending from the terminal pad to the substrate.

15. A semiconductor package comprising:

a substrate;

a semiconductor die coupled to the substrate, said semiconductor die including a first surface with an outer edge, and terminal pad at the first surface;

an insulative spacer having a first surface, and an opposite second surface coupled to the first surface of the semiconductor die between the terminal pad and the outer edge;

an electrically conductive path passing across the first surface of the spacer and electrically coupling the terminal pad to the substrate; and a means coupled to the substrate for protectively covering the semiconductor die, the spacer, the electrically conductive path, and at least a portion of the substrate, wherein the electrically conductive path is a single electrical conductor extending from the terminal pad to the substrate.

16. A semiconductor package comprising:

a substrate;

a semiconductor die coupled to the substrate, said semiconductor die including a first surface with an outer edge, and terminal pad at the first surface;

an insulative spacer having a first surface, an electrically conductive region confined to the first surface of the spacer, and an opposite second surface coupled to the first surface of the semiconductor die between the terminal pad and the outer edge; and an electrically conductive path passing across the first surface of the spacer and electrically coupling the terminal pad to the substrate, wherein the electrically conductive path includes at least one electrical conductor bonded to the electrically conductive region.

17. The semiconductor package of claim 16, wherein the electrically conductive path includes a first electrical conductor having a first end coupled to the terminal pad and a second end coupled to the electrically conductive region, and second electrical conductor having a first end coupled to the electrically conductive region and a second end coupled to the substrate.

18. The semiconductor package of claim 16, further comprising a second semiconductor die over the first semiconductor die.

19. The semiconductor package of claim 18, further comprising an insulative layer, wherein the second semiconductor die is coupled to the first surface of the insulative spacer over the electrically conductive path through the insulative layer.

20. The semiconductor package of claim 18, wherein the second semiconductor die includes a first surface with an outer edge, and terminal pad at the first surface; and further comprising:

a second insulative spacer and a second electrically conductive path, wherein the second insulative spacer includes a first surface, and an opposite second surface coupled to the first surface of the second semiconductor die between the terminal pad and the outer edge, and the second electrically conductive path passes across the first surface of the second insulative spacer and electrically couples the terminal pad of the second semiconductor die to the substrate.

21. The semiconductor package of claim 16, wherein the electrically conductive path is a single electrical conductor extending from the terminal pad to the substrate.

22. The semiconductor package of claim 16, further comprising an enclosure coupled to the substrate and covering the semiconductor die, the spacer, the electrically conductive path, and at least a portion of the substrate.

23. The semiconductor package of claim 16, wherein the electrically conductive path comprises a metal wire bonded to the terminal pad on the semiconductor die with a ball bond, and a thickness of the spacer is equal to or greater than a height of the wire above the die.

24. The semiconductor package of claim 16, wherein the electrically conductive path is a single electrical conductor extending from the terminal pad to the substrate.

25. A semiconductor package comprising:

a substrate;

a semiconductor die coupled to the substrate, said semiconductor die including a first surface with a perimeter, and terminal pad at the first surface;

an insulative spacer having a first surface, an electrically conductive region confined to the first surface, and a second surface opposite the first surface and coupled to the first surface of the semiconductor die between the terminal pad and the perimeter;

a first electrical conductor coupled between the terminal pad and the electrically conductive region, and a second electrical conductor coupled between the electrically conductive region and the substrate; and a means coupled to the substrate for protectively covering the semiconductor die, the spacer, the first and second electrical conductors, and at least a portion of the substrate.

26. The semiconductor package of claim 25, further comprising a second semiconductor die over the first semiconductor die and covered by said means.

27. The semiconductor package of claim 26, wherein the second semiconductor is coupled to the first surface of the insulative spacer through an insulative layer.

28. The semiconductor package of claim 26, wherein the second semiconductor die includes a first surface with a perimeter, and terminal pad at the first surface; and further comprising a second insulative spacer coupled to the first surface of the second semiconductor die between the terminal pad and the perimeter; and an electrically conductive path passing over the second spacer and electrically coupling the terminal pad of the second semiconductor die and the substrate.

29. A semiconductor package comprising:

a substrate;

a semiconductor die coupled to the substrate, said semiconductor die including a first surface with an outer edge, and terminal pad at the first surface;

an electrically conductive path coupling the terminal pad to the substrate; and an insulative spacer having a first surface and an opposite second surface, wherein the first surface includes a groove extending parallel to a direction of the electrically conductive path, a portion of the electrically conductive path is within said groove, and the second surface of the insulative spacer is coupled to the first surface of the semiconductor die between the terminal pad and the outer edge.

30. The semiconductor package of claim 29, further comprising a means coupled to the substrate and for protectively covering the semiconductor die, the spacer, the first and second electrical conductors, and at least a portion of the substrate.

31. The semiconductor package of claim 29, further comprising an enclosure coupled to the substrate and covering the semiconductor die, the spacer, the electrically conductive path, and at least a portion of the substrate.

32. The semiconductor package of claim 29, further comprising a second semiconductor die within said package over the first semiconductor die, wherein the second semiconductor is coupled to the first surface of the insulative spacer through an insulative layer, and is electrically coupled to the substrate.

33. The semiconductor package of claim 32, wherein the electrically conductive path is a single electrical conductor extending from the terminal pad of the first semiconductor die to the substrate.

34. The semiconductor package of claim 32, wherein the electrically conductive path is a single electrical conductor extending from the terminal pad to the substrate.

35. The semiconductor package of claim 29, wherein the electrically conductive path is a single electrical conductor extending from the terminal pad to the substrate.

36. A semiconductor package comprising:

a substrate;

a first semiconductor die coupled to the substrate, said first semiconductor die including a first surface with an outer edge, and terminal pad at the first surface;

an insulative spacer having a first surface, and an opposite second surface coupled to the first surface of the first semiconductor die between the terminal pad and the outer edge;

an electrically conductive path passing across the first surface of the spacer and electrically coupling the terminal pad to the substrate; and a second semiconductor die over the first die and coupled to the first surface of the insulative spacer over the electrically conductive semiconductor path, wherein the second semiconductor die is electrically coupled to the substrate, wherein the electrically conductive path is a single electrical conductor extending from the terminal pad of the first semiconductor die to the substrate.

37. The semiconductor package of claim 36, further comprising a means coupled to the substrate and for protectively covering the first and second semiconductor dies, the insulative spacer, the electrically conductive path, and at least a portion of the substrate.

* * * * *